United States Patent
Park

(10) Patent No.: US 7,635,985 B2
(45) Date of Patent: Dec. 22, 2009

(54) TEST PATTERN FOR ANALYZING DELAY CHARACTERISTIC OF INTERCONNECTION LINE AND METHOD FOR ANALYZING DELAY CHARACTERISTIC OF INTERCONNECTION LINE USING THE SAME

(75) Inventor: Chan Ho Park, Goyang-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 579 days.

(21) Appl. No.: 11/614,110

(22) Filed: Dec. 21, 2006

(65) Prior Publication Data

US 2007/0145364 A1 Jun. 28, 2007

(30) Foreign Application Priority Data

Dec. 28, 2005 (KR) .................. 10-2005-0132481

(51) Int. Cl.
*G01R 27/08* (2006.01)
(52) U.S. Cl. .............. 324/691; 324/617; 324/76.35; 324/76.64
(58) Field of Classification Search ........... 324/691; 438/18; 331/57
See application file for complete search history.

(56) References Cited

U.S. PATENT DOCUMENTS

| | | | | |
|---|---|---|---|---|
| 4,392,105 A | * | 7/1983 | McLeod | 324/617 |
| 4,918,377 A | * | 4/1990 | Buehler et al. | 324/691 |
| 6,362,634 B1 | * | 3/2002 | Jarvis et al. | 324/719 |
| 7,187,179 B1 | * | 3/2007 | Scaman et al. | 324/512 |
| 2005/0012556 A1 | * | 1/2005 | Bhushan et al. | 331/57 |
| 2005/0023650 A1 | * | 2/2005 | Forbes | 257/664 |

* cited by examiner

*Primary Examiner*—Timothy J Dole
*Assistant Examiner*—Benjamin M Baldridge
(74) *Attorney, Agent, or Firm*—Saliwanchik, Lloyd & Saliwanchik

(57) ABSTRACT

A test pattern for analyzing a delay characteristic of an interconnection line and a method of analyzing a delay characteristic of an interconnection line using the test pattern are provided. The test pattern for analyzing a delay characteristic of an interconnection line includes: a first metal line formed as a snake shaped structure having a plurality of concave-convex sections each having the same width; a second metal line having a comb shape formed on the same layer as the first metal line such that a plurality of teeth portions of the second metal line are respectively formed between the concave-convex sections at one side of the first metal line; and a third metal line having a comb shape formed on the same layer as the first metal line such that a plurality of teeth portions of the third metal line are respectively formed between the concave-convex sections at the other side of the first metal line.

11 Claims, 4 Drawing Sheets

TEST PATTERN FOR ANALYZING DELAY CHARACTERISTIC OF INTERCONNECTION LINE AND METHOD FOR ANALYZING DELAY CHARACTERISTIC OF INTERCONNECTION LINE USING THE SAME

RELATED APPLICATION(S)

This application claims priority under 35 U.S.C. §119(e) of Korean Patent Application No. 10-2005-0132481 filed Dec. 28, 2005, which is incorporated herein by reference in its entirety.

FIELD OF INVENTION

The present invention relates to a test pattern for measuring a delay of an interconnection line in a semiconductor device.

BACKGROUND OF INVENTION

In general, in order to estimate a delay of a metal line in a semiconductor device, it is necessary to have information on parameters of the interconnection line, such as capacitance and resistance, and parameters of the interconnection line process, such as width reduction and the thickness of an interlayer dielectric layer.

Conventionally, information on these respective parameters is obtained by using an additional test pattern for extracting information on parameters of an interconnection line for measuring the delay of the interconnection line and information on parameters of the interconnection line process. In this case, since information on the respective parameters may not be extracted in the same environment, there is a problem in that a delay time occurring in an interconnection line may not be precisely estimated.

BRIEF SUMMARY

Accordingly, embodiments of the present invention have been made to address the above problem occurring in the prior art, and an object of the present invention is to provide a test pattern which can simultaneously extract information on parameters of an interconnection line and information on parameters of an interconnection line process in order to analyze a delay characteristic of the interconnection line.

Another object of the present invention is to provide a method of extracting information on respective parameters required in measuring a delay of an interconnection line by using the test pattern.

According to one embodiment of the present invention, there is provided a test pattern for analyzing a delay characteristic of an interconnection line, which includes: a first metal line formed as a snake shaped structure having a plurality of concave-convex sections each having the same width; a second metal line formed in the shape of a comb on the same layer as the first metal line such that a plurality of teeth portions of the second metal line are respectively formed between the concave-convex sections at one side of the first metal line; and a third metal line formed in the shape of a comb on the same layer as the first metal line such that a plurality of teeth portions of the third metal line are respectively formed between the concave-convex sections of the first metal line.

According to another embodiment of the present invention, there is provided a method of analyzing a delay characteristic of an interconnection line using a test pattern having first, second and third metal lines, the method including the steps of: measuring the capacitance and resistance of the first metal line over a range of widths for the first metal line; calculating the capacitance and resistance per unit length of the first metal line by using the measured capacitance and resistance of the first metal line; calculating the thickness of an insulating layer from the capacitance per unit length of the first metal line, and calculating sheet resistance and width reduction from the resistance per unit length of the first metal line; and analyzing a delay characteristic of an interconnection line by using the calculated capacitance, sheet resistance, thickness of the insulating layer, and width reduction.

DETAILED DESCRIPTION OF THE INVENTION

Hereinafter, a test pattern for analyzing a delay characteristic of an interconnection line and a method of analyzing a delay characteristic of an interconnection line using the test pattern according to preferred embodiments of the present invention will be described with reference to the accompanying drawings.

Figure 1:
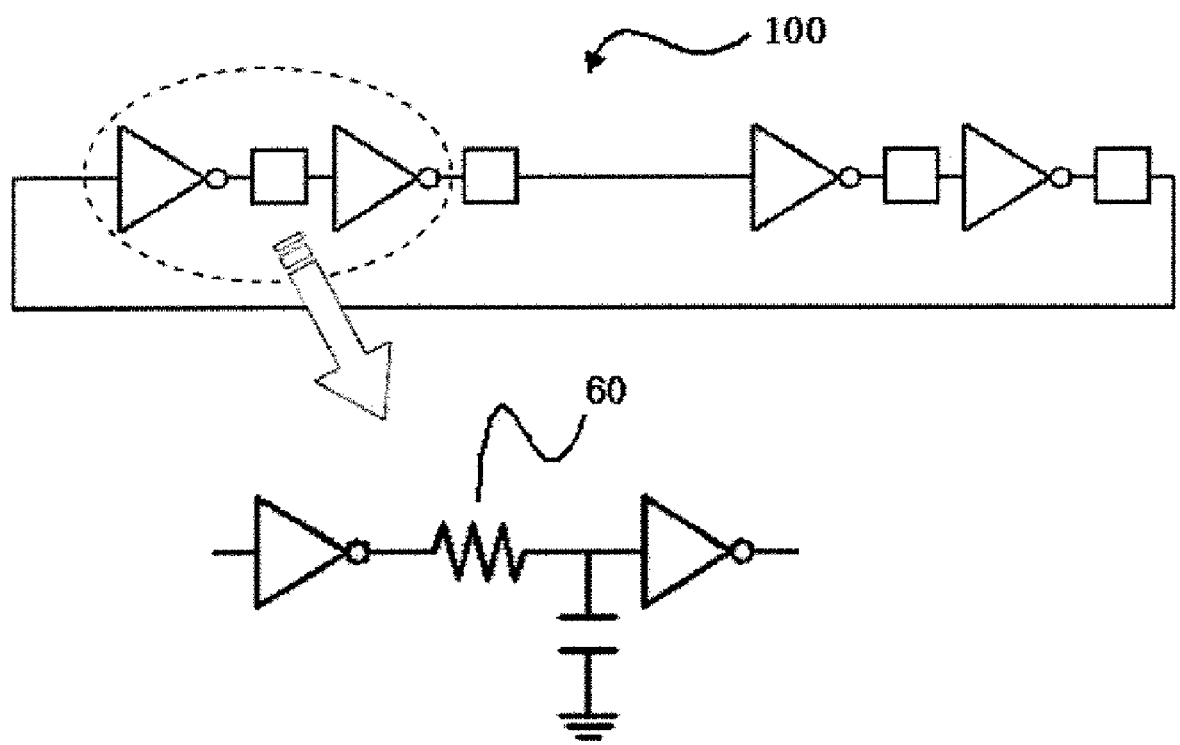
FIG. 1 is a schematic representation of a semiconductor device including a test pattern according to an embodiment of the present invention.

FIG. 1 is a schematic representation of a semiconductor device including a test pattern according to an embodiment of the present invention. Specifically, FIG. 1 shows a case where the test pattern 60 according to the embodiment of the present invention is inserted as an interconnect load of a ring oscillator 100.

Figure 2:
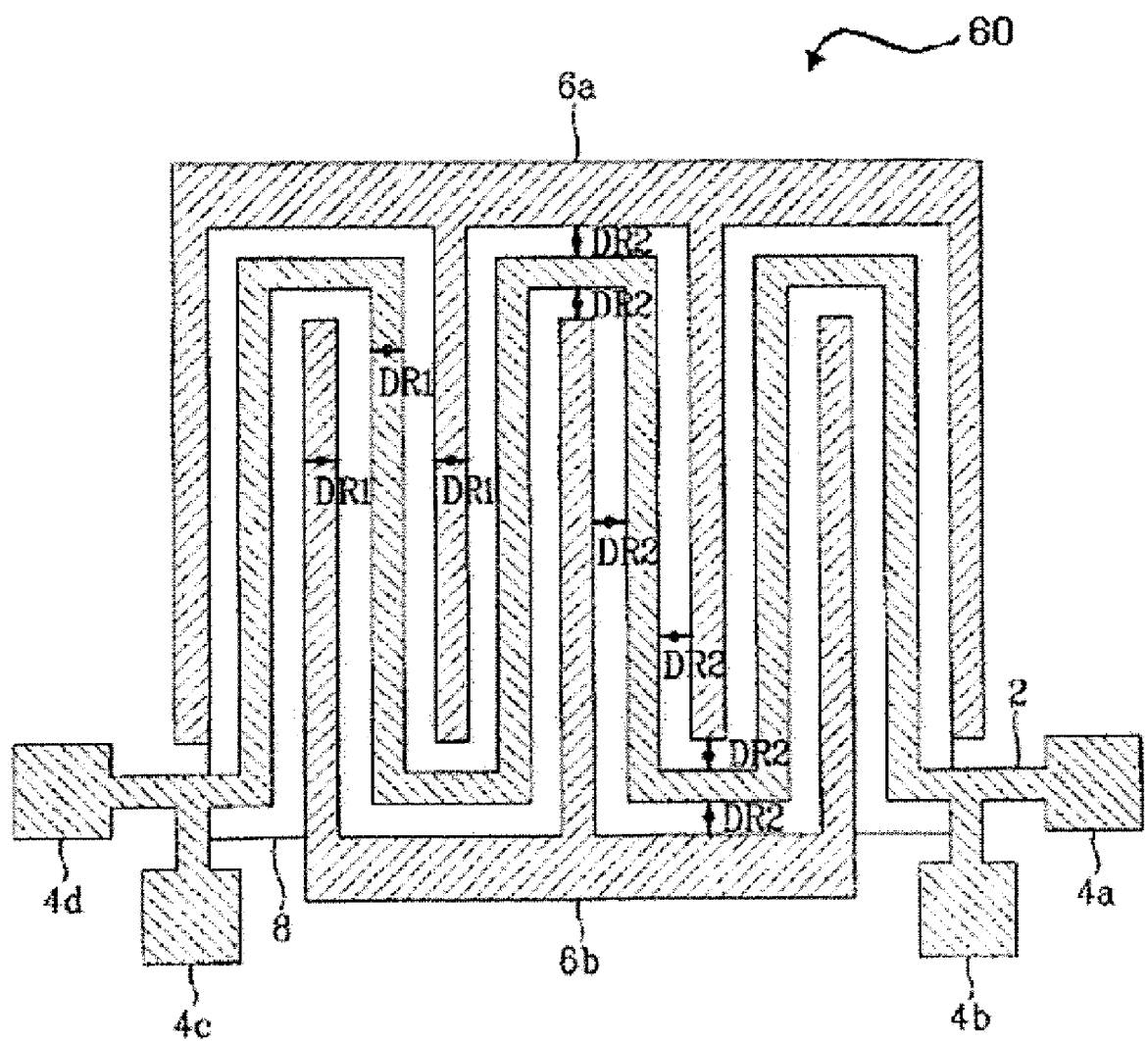
FIG. 2 is a layout view of a test pattern according to an embodiment of the present invention.

FIG. 2 shows an embodiment of the test pattern 60 for analyzing a delay characteristic of an interconnection line.

As shown in FIG. 2, the test pattern 60 can include a first metal line 2 formed as a snake-shaped structure having a plurality of concave-convex sections each having the same width; a plurality of probe pads 4a, 4b, 4c, and 4d connected to both ends of the first metal line 2; a second metal line 6a of a comb shape having a plurality of teeth portions formed on the same layer as the first metal line 2 such that the plurality of teeth portions of the second metal line 6a are formed between the concave-convex sections at one side of the first metal line 2; a third metal line 6b of a comb shape having a plurality of second teeth portions formed on the same layer as the first metal line 2 and second metal line 6a such that the plurality of second teeth portions of the third metal line 6b are formed between the concave-convex sections at the other side of the first metal line 2; and ground plates 8 respectively formed on upper and lower layers above and below the layer having the first, second and third metal lines 2, 6a and 6b.

The first metal line 2 is a metal line that can be used for measuring line capacitance, line resistance, width reduction and dielectric thickness. In a specific embodiment, Kelvin-type probe pads for exact extraction of sheet resistance can be connected to both ends of the first metal line 2. That is, the four probe pads 4a, 4b, 4c, and 4d are connected at both ends of the first metal line 2 as two probe pads per end.

The second and third metal lines 6a and 6b are metal lines that can form aggressor line capacitance and are prepared in the shape of a comb. As described above, the second and third metal lines 6a and 6b are formed on the same layer as the first metal line 2.

The form of the second and third metal lines 6a and 6b will be described in detail. A concave portion between two adjacent teeth of the second metal line 6a is formed to correspond to a tooth portion of the third metal line 6b with the first metal line 2 interposed therebetween, and a tooth portion of the second metal line 6a is formed to correspond to a concave portion between two adjacent teeth of the third metal line 6b with the first metal line 2 interposed therebetween. At this time, although not shown in this figure, probe pads respectively connected to the second and third metal lines 6a and 6b can be merged.

Ground plates 8 serving as a reference for measuring the thickness of an insulating layer can be respectively formed on upper and lower layers above and below the layer having first, second and third metal lines 2, 6a and 6b as described above. That is, the ground plates 8 are formed to cover the first, second and third metal lines 2, 6a and 6b in a sandwich form. Although not shown in this figure, probe pads can be connected to the ground plates 8, respectively.

Since the aforementioned test pattern can have the same structure as an interconnect load inserted into a ring oscillator, capacitance and resistance for analyzing a delay characteristic of an interconnection line can be more precisely extracted.

A method of analyzing a delay characteristic using the aforementioned test pattern will be described below. First, spaces DR2 between the first metal line 2 and second and third metal lines 6a and 6b of the test pattern are fixed, and the capacitance and resistance of the first metal line 2 are measured while changing the width DR1 of the first metal line 2 by a certain interval. In FIG. 2, the width DR1 of the first metal line 2 is set to be identical to those DR1 of the second and third metal lines 6a and 6b.

In a preferred embodiment, the capacitance and resistance of the first metal line 2 are measured while changing the width of the first metal line 2 at least three times or more for the purpose of extraction of exact data. That is, three or more test patterns can be formed, each having a successively larger width for the first metal line 2, and data can be extracted from each test pattern.

The capacitance and resistance per unit length of the first metal line 2 are calculated from the measured capacitance and resistance of the first metal line 2.

Then, the thickness $T_{ox}$ of an insulating layer is calculated from the capacitance per unit length of the first metal line 2, and sheet resistance and width reduction are calculated from the resistance per unit length of the first metal line 2.

In addition, a delay characteristic of an interconnection line can be analyzed by using the capacitance, sheet resistance, thickness of the insulating layer and width reduction calculated with the test pattern.

At this time, a method of calculating the thickness of the insulating layer will be described in detail with reference to FIG. 3.

Figure 3:
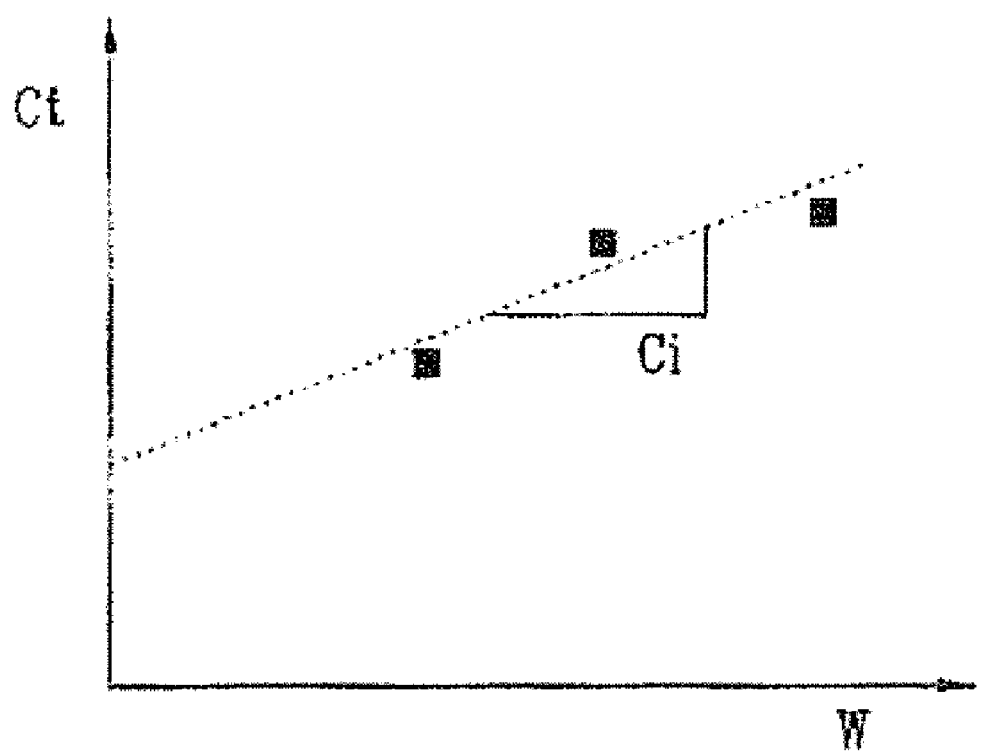
FIG. 3 is a graph illustrating a change in capacitance depending on a change in width of a metal line according to an embodiment of the present invention.

As shown in FIG. 3, the capacitance per unit length corresponding to the width of the first metal line 2 can be expressed as a function. All measured capacitances are not used. Rather, the measured capacitances between layers different from the first metal line 2 are used, (i.e., capacitances of the first metal line 2 with the layers above and below the layer having the first metal line 2).

FIG. 3 illustrates the relationship between the capacitance of the layer having the first metal line 2 with the layer below the first metal line (Ct) and the width of the first metal line 2 (W). Then, the slope Ci of a trend line is calculated by using the trend line of the capacitance and the width, and the thickness of the insulating layer can then be calculated by using the following Equation 1:

$$T_{ox} = \frac{\varepsilon_{ox}}{C_i}$$
$$T_{ox} = \frac{\varepsilon_{ox}}{C_i}$$

Equation 1

Here, $\varepsilon_{ox}$ denotes dielectric permittivity, which is a value multiplying dielectric permittivity in a vacuum state by the dielectric permittivity of an interlayer dielectric layer.

Next, a method of calculating sheet resistance and width reduction will be described in detail with reference to FIG. 4.

Figure 4:
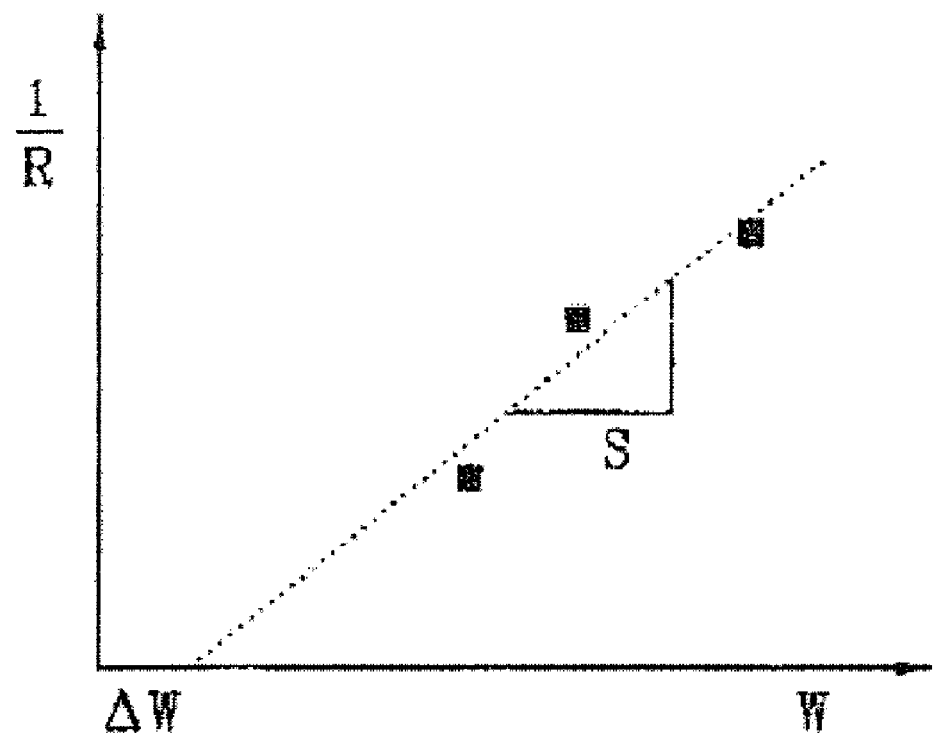
FIG. 4 is a graph illustrating a change in 1/R depending on a change in width of the metal line according to an embodiment of the present invention.

First, as shown in FIG. 4, the reciprocal of the resistance (1/R) per unit length of the first metal line 2 is calculated, and the reciprocal of resistance per unit length corresponding to the width of the first metal line 2 is expressed as a function. Then, the slope S of a trend line can be calculated by using the trend line of the reciprocals. Sheet resistance $R_{sh}$ is calculated by using the following Equation 2:

$$R_{sh} = \frac{1}{S}$$
$$R_{sh} = \frac{1}{S}$$

Equation 2

Further, the intersection point of the trend line with the X-axis, denoting numerical values of the width of the first metal line 2, is obtained. This intersection point provides the width reduction ($\Delta W$), which is the difference between the width $W_{eff}$ of a real line on a semiconductor substrate and the width W of a line on a layout design.

That is, the width $W_{eff}$ of a real line in the first metal line 2 is expressed by the following equation:

$$W_{eff} = W - \Delta W$$

Here, W denotes the width of a line on the layout, and $\Delta W$ denotes the width reduction $\Delta W$ of the first metal line.

At this time, a method of analyzing a delay characteristic using the calculated data will be described in detail.

The method of analyzing a delay characteristic of an interconnection line is analyzed by using resistance R and capacitance C. The resistance R and the capacitance C can be expressed by the following Equation 3:

$$R = f(R_{sh}, L, W_{eff}), C = f(\varepsilon, W_{eff}, DR2, L, H, T_{ox})$$

Equation 3

Here, $R_{sh}$ denotes sheet resistance, L denotes the length of the first metal line, $W_{eff}$ denotes the width of a real line in the first metal line, $\varepsilon$ denotes dielectric permittivity, DR2 denotes a space between first, second and third metal lines, H denotes the height of the first metal line, and $T_{ox}$ denotes the thickness of the insulating layer.

As described with respect to FIG. 1, the test pattern 60 according to an embodiment of the present invention can be inserted into a ring oscillator 100 as an interconnect load.

An interconnect load between inverters provides an RC delay component to the ring oscillator 100. Here, R and C are expressed by the Equation 3.

Parameters constituting each of the components R and C can be obtained as described above with respect to FIGS. 3 and 4.

The extracted parameters can be applied to a SPICE simulation as they are so as to have the test pattern 60 according to the present invention, and a simulation can be conducted using the ring oscillator 100 by applying an interconnect load so as to compare the extracted parameters with measured data. Therefore, an estimation of process variation can be accomplished through performing the ring oscillator simulation. Accordingly, exact variation of an interconnect model can be provided through such a process.

As described above, in a test pattern and a method of analyzing a delay characteristic of an interconnection line using the test pattern according to an embodiment of the present invention, there is an advantage in that a test pattern can have the same structure as an interconnect load inserted into a ring oscillator. Therefore capacitance and resistance for analyzing a delay characteristic of an interconnection line can be more precisely extracted.

Further, there is an advantage in that capacitance and resistance of an interconnection line itself and the thickness of an insulating layer and width reduction, which are parameters in an interconnection line process, can be precisely extracted through one test pattern.

It should be understood that the examples and embodiments described herein are for illustrative purposes only and that various modifications or changes in light thereof will be suggested to persons skilled in the art and are to be included within the spirit and purview of this application.

I claim:

1. A method of analyzing a delay characteristic of an interconnection line in a semiconductor device using a test pattern fabricated in the semiconductor device having a first metal line shape similar to that of the interconnection line, wherein the test pattern includes the first metal line formed as a snake shaped structure having a plurality of concave-convex sections each having the same width; a second metal line formed in a comb shape on the same layer as the first metal line such that a plurality of teeth portions of the second metal line are respectively formed between the concave-convex sections at one side of the first metal line; a third metal line formed in a comb shape on the same layer as the first metal line such that a plurality of teeth portions of the third metal line are respectively formed between the concave-convex sections at the other side of the first metal line; a plurality of probe pads connected at both ends of the first metal line; and ground plates respectively formed on upper and lower layers above and below the layer having the first, second and third metal lines, the method comprising the steps of:

measuring the capacitance and resistance of the first metal line over a range of widths for the first metal line;

calculating the capacitance and resistance per unit length of the first metal line using the measured capacitance and resistance of the first metal line;

calculating the thickness of an insulating layer from the capacitance per unit length of the first metal line;

calculating sheet resistance and width reduction from the resistance per unit length of the first metal line; and analyzing a delay characteristic of an interconnection line using the calculated capacitance, calculated sheet resistance, calculated thickness of the insulating layer and calculated width reduction.

2. The method of claim 1, wherein the capacitance and resistance of the first metal line are measured for at least three different widths of the first metal line.

3. The method of claim 1, wherein the first metal line, the second metal line, and the third metal line are formed having a same width.

4. The method of claim 1, wherein calculating the thickness of the insulating layer comprises:

expressing capacitance per unit length corresponding to the width of the first metal line as a function;

showing a trend line of capacitances corresponding to the respective widths of the first metal line; and calculating the slope of the trend line, and calculating the thickness of the insulating aver using the slope of the trend line.

5. The method of claim 4, wherein the thickness of the insulating layer is calculated using the following equation:

$$T_{ox} = \frac{\varepsilon_{ox}}{C_i}$$

wherein, $T_{ox}$ denotes the thickness of the insulating layer, $C_i$ denotes the slope of the trend line, and $\varepsilon_{ox}$ denotes multiplication of dielectric permittivity in a vacuum state by the dielectric permittivity of an interlayer dielectric layer.

6. The method of claim 4, wherein the capacitances corresponding to the respective widths of the first metal line are the capacitances of the layer having the first metal line with the upper and lower layers above and below the layer having the first metal line.

7. The method of claim 1, wherein calculating the sheet resistance comprises:

calculating the reciprocal of resistance per unit length of the first metal line;

expressing the reciprocal of resistance per unit length corresponding to the width of the first metal line as a function;

showing a trend line of the reciprocals of resistance per unit length corresponding to the respective widths of the first metal line; and calculating the slope of the trend line and calculating sheet resistance using the slope of the trend line.

8. The method of claim 7, wherein the sheet resistance is calculated using the following equation:

$$R_{sh} = \frac{1}{S}$$

wherein, $R_{sh}$ denotes sheet resistance, and S denotes the slope of a trend line.

9. The method of claim 1, wherein calculating the width reduction comprises:

calculating the reciprocal of resistance per unit length of the first metal line;

expressing the reciprocal of resistance per unit length corresponding to the width of the first metal line as a function;

showing a trend line of the reciprocals of resistance per unit length corresponding to the respective widths of the first metal line; and determining the intersection point ($\Delta W$) with an X-axis representing widths of the first metal line, thereby calculating width reduction.

10. The method of claim 1, wherein analyzing a delay characteristic of the interconnection line comprises using resistance R and capacitance C, wherein the resistance R is calculated as a function of Rsh, L, $W_{eff}$, and the capacitance C is calculated as a function of $\epsilon$, $W_{eff}$, DR2, L, H, Tox, wherein Rsh denotes sheet resistance, L denotes the length of the first metal line, $W_{eff}$ denotes the effective width of the first metal line, $\epsilon$ denotes a dielectric permittivity of the insulating layer, DR2 denotes a space between first, second and third metal lines, H denotes the height of the first metal line, and Tox denotes the thickness of the insulating layer.

11. The method of claim 10, wherein the width $W_{eff}$ of a real line of the first metal line is expressed by the following equation:

$$W_{eff} = W - \Delta W$$

where, W denotes the width of a line on the layout, and $\Delta W$ denotes the width reduction $\Delta W$ of the first metal line.

* * * * *